(12) United States Patent
Nakatani

(10) Patent No.: US 7,443,021 B2
(45) Date of Patent: Oct. 28, 2008

(54) ELECTRONIC COMPONENT PACKAGING STRUCTURE AND METHOD FOR PRODUCING THE SAME

(75) Inventor: Seiichi Nakatani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 11/550,677

(22) Filed: Oct. 18, 2006

(65) Prior Publication Data

US 2007/0081314 A1      Apr. 12, 2007

Related U.S. Application Data

(62) Division of application No. 10/840,583, filed on May 5, 2004, now Pat. No. 7,141,874.

(30) Foreign Application Priority Data

May 14, 2003   (JP)   ............................. 2003-135799

(51) Int. Cl.
   *H01L 29/40*   (2006.01)
(52) U.S. Cl. .............................. 257/700; 257/E23.061; 257/E25.023; 156/252
(58) Field of Classification Search ................ 257/686, 257/698, 700, E23.061, E25.023; 156/252
See application file for complete search history.

(56) References Cited

U.S. PATENT DOCUMENTS 5,436,503 A    7/1995   Kunitomo et al.
5,481,795 A    1/1996   Hatakeyama et al.
5,484,647 A    1/1996   Nakatani et al.
6,038,133 A    3/2000   Nakatani et al.
2004/0021218 A1    2/2004   Hayama et al.

FOREIGN PATENT DOCUMENTS

| JP | 6-224259 | 8/1994 |
|---|---|---|
| JP | 8-340021 | 12/1996 |
| JP | 2002-280713 | 9/2002 |
| JP | 2003-037242 | 2/2003 |
| JP | 2003124429 | 4/2003 |

*Primary Examiner*—Thomas L Dickey
(74) *Attorney, Agent, or Firm*—Hamre, Schumann, Mueller & Larson, P.C.

(57) ABSTRACT

An electronic component packaging structure, includes: circuit boards each having a wiring at least on a surface thereof; and an electronic component package secured between the circuit boards. The electronic component package includes at least one electronic component embedded within an electrical insulating encapsulation resin molded member made of an inorganic filler and a resin, the at least one electronic component being selected from an active component and a passive component, protruding electrodes are arranged on both faces of the electrical insulating encapsulation resin molded member, and the electronic component is connected electrically with at least a part of the protruding electrodes. This configuration allows circuit boards to be connected with each other and a high-density and high-performance structure.

10 Claims, 9 Drawing Sheets

ELECTRONIC COMPONENT PACKAGING STRUCTURE AND METHOD FOR PRODUCING THE SAME

This application is a division of application Ser. No. 10/840,583, filed May 5, 2004.

BACKGROUND OF THE INVENTION

1. Field of the Invention

The present invention relates to an electronic component packaging structure with semiconductors and passive components built therein and a method for producing the same. The present invention further relates to an electronic component packaging structure that allows circuit boards to be electrically-connected minutely and a method for producing the same.

2. Related Background Art

In recent years, with a demand for high-performance and compact electronic equipment, semiconductor packages with still higher density and higher functionality have been demanded. Furthermore, in order to mount such a semiconductor package, compact and high-density circuit boards also are demanded.

Since a conventional glass epoxy board that utilizes a through hole structure formed with a drill is becoming incapable of coping with higher-density packaging, circuit boards capable of inner via hole connection are now being developed energetically in lieu of the conventional glass epoxy multilayer board (See U.S. Pat. No. 5,481,795 (FIG. 7), for example).

However, in fact, it is the current state that even the high-density packaging board with the inner via structure does not keep up with finer design rules on semiconductors. Specifically, although a pitch of lead-out electrodes is made finer to about 50 μm in accordance with finer wirings of a semiconductor, a pitch of wirings and a pitch of vias of a circuit board are still about 100 μm, and therefore a space for leading-out of the electrodes from the semiconductor becomes large. This factor impairs the miniaturization of a semiconductor package.

Meanwhile, as a configuration for coping with the miniaturization of the semiconductor, a chip size package (CSP) is proposed (See H06(1994)-224259 A (FIG. 1), for example). According to the configuration disclosed in H06(1994)-224259 A, a semiconductor package is flip-chip bonded on a circuit board, and further a grid-form electrode is formed two-dimensionally on a lower face of the circuit board, thus widening a pitch of connection electrodes. The grid-form electrode has a structure such that electrodes with a pitch of 100 μm or less, on which a semiconductor is flip-chip bonded, are led out in a grid form through the via connection in a circuit board called an interposer. This configuration enables a pitch of lead-out electrodes of about 0.5 to 1.0 mm. As a result, there is no need to make the circuit board for mounting the CSP so fine, and a low cost circuit board can be used. In addition, the use of the CSP has an advantage of allowing the resulting configuration to be treated like a semiconductor package whose reliability has been examined and ensured, as compared with the handling of a semiconductor bare chip. As a result, the cost required for broken chips, examination of faulty elements and securing the reliability can be reduced, as compared with the bare-chip technique in which a semiconductor is directly mounted on a circuit board. Moreover the package can be miniaturized, which is an advantage of the bare chip mounting.

As a result of the development of such a CSP, a semiconductor package is becoming smaller in size. However, with the development of the Internet, these is a demand for further smaller equipment such as a mobile personal computer that allows information to be dealt with personally and information terminals typified by mobile phones. In the light of the demand for smaller equipment, the miniaturization of semiconductor packages and the miniaturization of circuit boards approach their limits, and it becomes difficult for the conventional configuration for packaging components on the circuit board to realize further smaller and higher-density package. This is because, even when a pitch of the connection terminals of a semiconductor package is narrowed, there is a limit on the miniaturization of a wiring pattern of a circuit board, and a circuit board with a more multilayered configuration has to be used for mounting the narrowed-pitch semiconductor package, thus increasing the cost for the packaging.

To cope with these problems, a method for realizing a multilayered configuration using a circuit board at a low cost and a three-dimensional packaging configuration for embedding a component such as a semiconductor in a board are proposed. Further, a proposal is made for connecting such circuit boards mutually for the still higher density packaging (See U.S. Pat. No. 5,484,647 (FIG. 5), for example). U.S. Pat. No. 5,484,647 discloses that a prepreg having an inner via structure using a conductive paste is sandwiched between circuit boards and hot pressing is applied thereto, whereby a multilayered configuration can be realized with efficiency.

Furthermore, as the three-dimensional packaging configuration, for example, a proposal is made for achieving still higher density by embedding a semiconductor and a chip component in a board (See U.S. Pat. No. 6,038,133 (FIG. 4) and JP 2002-280713 A, for example). U.S. Pat. No. 6,038,133 and JP 2002-280713 A show an example where a semiconductor and a chip component are formed in a board so as to realize a multilayered configuration.

Furthermore, JP H08(1996)-340021 A proposes a technology for attaching a wiring film on a surface of a semiconductor chip with an adhesive.

As described above, efforts to make a semiconductor package smaller and to narrow its pitch approach their limits, and therefore further miniaturization thereof requires an increase in cost for packaging and an expensive circuit board.

Meanwhile, as for the conventional example in which hot pressing is applied to low-cost circuit boards using a prepreg having an inner via structure so as to form a multilayered configuration of the circuit boards, this example is only for enabling the multilayered configuration and not for obtaining a minute wiring pattern. Furthermore, in the case where the circuit board is manufactured in a large sheet form, followed by division into the individual pieces so as to reduce a cost for the mass production, a large scale apparatus is required conversely for manufacturing the circuit board, which means that a cost will be increased for the multilayered structure as a package or a module. Therefore, this is not suitable for the mass production. Furthermore, in the hot pressing method, a heating and curing process at about 180° C. for 1 hour or more is required, which leads to a problem of a process time becoming longer.

Furthermore, in the case of a component built-in board having a three-dimensional packaging configuration, already-existing semiconductors and passive components can be built therein. Therefore, such a board has an advantage of allowing even the conventional circuit board to be packaged with higher density. However, when the components are embedded in the circuit board, a long process time is required as described above, and moreover if there is a malfunction found in an examination after the embedding operation, the component cannot be exchanged.

Meanwhile, as the means for connecting a module on which components are packaged with a circuit board, there is a connector connection method available. However, the connector itself is large in size and a space is required for mounting the connector on a mother board, which becomes an obstacle to high-density packaging.

SUMMARY OF THE INVENTION

Therefore, with the foregoing in mind, it is an object of the present invention to provide an electronic component packaging structure that includes a package having protruding electrodes provided at upper and lower faces of the package, having a semiconductor and a passive component embedded therein and allows the connection of circuit boards so as to enable high-density and high-performance packaging, and a method for manufacturing the same.

An electronic component packaging structure of the present invention includes: circuit boards each having a wiring at least on a surface thereof; and an electronic component package secured between the circuit boards. The electronic component package includes at least one electronic component embedded within an electrical insulating encapsulation resin molded member made of an inorganic filler and a resin, and the at least one electronic component is selected from an active component and a passive component. Protruding electrodes are arranged on both faces of the electrical insulating encapsulation resin molded member, and the electronic component is connected electrically with at least a part of the protruding electrodes.

According to a method for manufacturing an electronic component packaging structure of the present invention is for manufacturing an electronic component packaging structure including: circuit boards each having a wiring at least on a surface thereof; and an electronic component, package mechanically secured and electrically connected between the circuit boards. This method includes the steps of: preparing an electronic component package by embedding at least one electronic component that is selected from an active component and a passive component within an electrical insulating encapsulation resin molded member made of an inorganic filler and a resin; arranging protruding electrodes on both faces of the electrical insulating encapsulation resin molded member, wherein during this step, a wiring taken out of the electronic component package to the outside of the electrical insulating encapsulation resin molded member is connected with a part of the protruding electrodes; and connecting electrically the protruding electrodes and wirings of the circuit boards with each other.

DETAILED DESCRIPTION OF THE INVENTION

Figure 1:
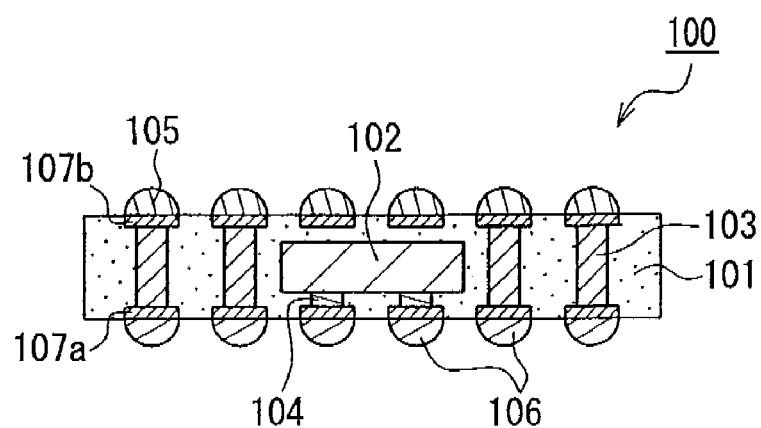
FIG. 1 is a cross-sectional view showing a configuration of an electronic component package used for an electronic component packaging structure according to Embodiment 1 of the present invention.

According to the electronic component packaging structure of the present invention, an electronic component package thereof includes at least one electronic component that is selected from an active component (e.g., semiconductor) and a passive component within an electrical insulating encapsulation resin molded member made of an inorganic filler and a resin and includes protruding electrodes provided at upper and lower faces of the package so as to allow the connection of circuit boards and enables a high density and high performance structure.

In the present invention, the "electronic component packaging structure" refers to a structure in which one or more electronic components are mounted on a structure for wiring (board and the like). The "wiring" refers to an element for transferring electric signals, which normally is made of metal. The "electronic component" is a generic name for an active element (semiconductor element, semiconductor package, quartz resonator, surface acoustic wave (SAW) filter, etc.,) and a passive element (resistor, inductor, capacitor, etc.). The "electronic component package" refers to one for packaging the above-stated active elements and/or the passive elements. The "chip component" refers to minute components whose sizes are specified like 1005, 0603, which are found in the passive element components including a resistor, an inductor, a capacitor and the like. The "semiconductor element" refers to a semiconductor that has not been packaged. In the case of the bare-chip packaging, the semiconductor element is mounted on a board. When the semiconductor element is packaged (QFP, BGA, CSP, etc.), the resulting is a semiconductor package.

The protruding electrodes preferably have a length of the protrusion of about 10 to 250 µm, a diameter of about 50 to 250 µm and a pitch (a distance between one protruding electrode and an adjacent protruding electrode, including a space therebetween) of about 100 to 500 µm. The protruding electrodes preferably are made of metal, and particularly are made of solder.

It is preferable that in a part of the protruding electrodes on the both faces of the electrical insulating encapsulation resin molded member, upper and lower protruding electrodes are electrically connected by means of inner vias. With this configuration, upper and lower circuit boards can be connected in a short distance by means of the inner vias in the board, and more functions can be realized at the same time because of the semiconductor embedded therein.

It is preferable that the electronic component includes at least two semiconductor elements whose faces on sides opposite to their circuit-formation faces are attached together, and a thickness of the electrical insulating encapsulation resin molded member is substantially equal to a total thickness of the two semiconductor elements. With this configuration, the circuit boards can be connected with each other by using the connection terminals on upper and lower faces, and more functions can be realized at the same time because two semiconductor elements are embedded. In the above-description, "a thickness of the electrical insulating encapsulation resin molded member is substantially equal to a total thickness of the two semiconductor elements" means that a difference in thickness is within 10% of the total thickness of the two semiconductor elements. Furthermore, this configuration can make the total thickness smaller. In the above-described configuration, an adhesion layer for bonding the semiconductor elements and an encapsulation resin may be present on a surface thereof to some extent.

Upper and lower protruding electrodes on the both faces of the electrical insulating encapsulation resin molded member may be connected electrically with each other by using a flexible wiring board (FPC) that is bent. With this configuration, high-density and high-performance electrical component packaging structure can be obtained because a component such as a semiconductor is embedded therein, and moreover since this configuration allows the direct connection between the upper and lower faces by the connection of the flexible board, the circuit boards can be directly connected electrically.

The circuit boards may be at least one selected from a double-sided board and a multilayered board.

The above electronic component package may include: an electronic component package circuit board; protruding electrodes provided at arbitrary positions of a face of the electronic component package circuit board that is on a side opposite to a face bonded with the electrical insulating encapsulation resin molded member; protruding electrodes provided at arbitrary positions of a face of the electrical insulating encapsulation resin molded member that is on a side opposite to a face bonded with the electronic component package circuit board; and at least two semiconductor elements embedded in the electrical insulating encapsulation resin molded member. A first semiconductor element may be mounted on the electronic component package circuit board and a circuit-formation face of the first semiconductor element may be connected electrically with the electronic component package circuit board by wire bonding, a second semiconductor element may be bonded onto the first semiconductor element, and a circuit-formation face of the second semiconductor element may be connected electrically with the protruding electrodes provided at the arbitrary positions of the surface of the electrical insulating encapsulation resin molded member on the side opposite to the face bonded with the electronic component package circuit board. Since this configuration is provided with the electronic component package circuit board at its lower face, the rewiring of the connection with the semiconductor can be realized, and therefore lead-out electrodes with a fine pitch can be configured.

The embedded semiconductor element may be mounted on the electronic component package circuit board and a circuit-formation face of the embedded semiconductor element may be connected electrically with the electronic component package circuit board by wire bonding, and the protruding electrodes on the electronic component package circuit board side and the protruding electrodes on the electrical insulating encapsulation resin molded member side may be connected electrically by means of a lead frame and a bonding wire. With this configuration, high-density and high-performance electrical component packaging structure can be obtained because a component such as a semiconductor is embedded therein, and moreover since this configuration allows the direct connection between the upper and lower faces by the connection between the electronic component package circuit board and the lead frame using the wire bonding, the circuit boards can be directly connected electrically.

The embedded semiconductor element may be mounted on the electronic component package circuit board and a circuit-formation face of the embedded semiconductor element may be connected electrically with the circuit board by a flip-chip method, and the protruding electrodes on the electronic component package circuit board side and the protruding electrodes on the electrical insulating encapsulation resin molded member side may be connected electrically by means of a metal ball. With this configuration, a high-density and high-performance electrical component packaging structure can be obtained because a component such as a semiconductor is embedded therein. Moreover since this configuration allows the direct connection between the upper and lower faces by the connection between the electronic component package circuit board and the protruding electrodes using the metal ball, the circuit boards can be directly connected electrically.

It is preferable that the circuit boards are one in which thermosetting resin is impregnated with a reinforcing material. With this configuration, the semiconductor package having an excellent mechanical strength and having a thermal stability can be obtained.

It is preferable that the circuit boards are a resin film made of a thermoplastic resin. With this configuration, a thin and easy-to-bending package can be obtained.

It is preferable that the thermosetting resin is at least one selected from the group consisting of epoxy resin, polyimide resin, polyphenylene ether resin, phenol resin, fluorine resin and isocyanate resin. With this configuration, the semiconductor package having a better thermal stability can be obtained.

It is preferable that the resin film is at least one selected from the group consisting of wholly aromatic polyester, fluorine resin, polyphenylene oxide resin, syndiotactic polystyrene resin, polyimide resin, polyamide resin, aramid resin and polyphenylene sulphide resin. With this configuration, the semiconductor package having a better thermal stability can be obtained.

It is preferable that the resin constituting the electrical insulating encapsulation resin molded member, made of the inorganic filler and the resin, is a thermosetting resin. With this configuration, the semiconductor package having an excellent mechanical strength and having a thermal stability can be obtained.

It is preferable that the inorganic filler is at least one selected from the group consisting of $SiO_2$, $Al_2O_3$, MgO, $TiO_2$, BN, AlN and $Si_3N_4$. With this configuration, a suitable thermal expansion coefficient and a thermal conductivity required for the semiconductor package can be obtained.

When $Al_2O_3$, BN and AlN are employed, a module with high thermal conductivity can be obtained. When MgO is employed, a favorable thermal conductivity can be obtained and a thermal expansion coefficient can be increased. When $SiO_2$ (especially, amorphous $SiO_2$) is employed, a lightweight module having a small thermal expansion coefficient and a small dielectric constant can be obtained.

It is preferable that the thermosetting resin is at least one selected from the group consisting of epoxy resin, polyimide resin, polyphenylene ether resin, phenol resin, fluorine resin and isocyanate resin. With this configuration, the semiconductor package that can be secured firmly with the semiconductor element and the circuit boards and has a thermal stability can be obtained.

A preferable mixture ratio of the inorganic filler and the thermosetting resin is within a range of the inorganic filler of 70 to 95 wt % and the thermosetting resin of 5 to 30 wt %.

It is preferable that the inner via comprises metal plating. With this configuration, thermally stable connection can be obtained.

It is preferable that the inner via comprises a conductive resin composition. With this configuration, a high-density circuit board can be utilized.

It is preferable that the protruding electrodes are formed with solder. With this configuration, the circuit boards can be connected with efficiency and in a short time period.

It is preferable that the passive component is a chip component. With this configuration, already-existing chip components can be embedded, and therefore there is no need to develop a special passive component, so that properties with high precision can be obtained.

The method for manufacturing a semiconductor package according to the present invention includes the following steps (a) to (c):

(a) bonding faces on sides opposite to circuit-formation faces of two semiconductor elements to each other;

(b) encapsulating with an electrical insulating encapsulation resin so that the resulting encapsulation faces are flush with the respective circuit-formation faces of the two semiconductor elements, and (c) forming protruding electrodes on the respective faces of the two semiconductor elements.

With this method, the semiconductor package for connecting circuit boards can be realized so as to include the two semiconductor elements embedded therein and protruding electrodes provided on upper and lower faces.

Another manufacturing method for a semiconductor package according to the present invention includes the following steps (d) to (h):

(d) die-bonding a semiconductor element on an electronic component package circuit board made of at least an electrical insulating material and a wiring pattern;

(e) connecting an electrode of the semiconductor element and the wiring pattern of the electronic component package circuit board by wire bonding;

(f) mounting a separately prepared semiconductor element on the thus mounted semiconductor element;

(g) conducting encapsulation up to a surface of the thus mounted semiconductor element with an electrical insulating encapsulation resin, and (h) forming the protruding electrodes at a surface of the encapsulated semiconductor element and at electrodes of the electronic component package circuit board.

With this method, the semiconductor package for connecting circuit boards can be realized so as to include the two semiconductor elements embedded therein and protruding electrodes provided on upper and lower faces.

It is preferable to add a step for dividing articles into a desired shape after the formation of the protruding electrodes. By manufacturing articles in a large sheet size, followed by the division into the individual pieces, a cost for mass production can be reduced.

It is preferable that the encapsulation of the semiconductor elements is carried out by applying heat and pressure at a temperature of a curing start temperature or lower of the resin. With this method, damage to the semiconductor embedded can be reduced.

It is preferable that the encapsulation of the semiconductor elements is carried out by a transfer molding method using the encapsulation resin. With this method, the resin can be filled and cured in a short time period, and therefore the products can be mass manufactured at a low cost. Herein, the transfer molding method refers to a molding method in which a batch of a material to be molded is put into a pot portion that is different from a mold cavity, and the material to be molded in a molten state is transferred to a cavity portion with a plunger so as to obtain a molded member.

As stated above, the semiconductor package of the present invention has a configuration including at least one semiconductor element and/or a passive component embedded therein and protruding electrodes on both faces, and therefore circuit boards can be connected by using the connection terminals on the upper and the lower faces and at the same time more functions can be realized because the semiconductor is embedded therein. Furthermore, since a semiconductor and a passive component can be mounted further on a surface of the semiconductor package, a high-density and high-performance circuit module can be realized. Furthermore, in the case where the protruding electrodes are connected by means of the inner vias within the semiconductor package, the circuit boards can be connected with still higher density.

According to another semiconductor package of the present invention, two semiconductor chips are embedded in the electrical insulating encapsulation resin composition, and electrodes of the respective semiconductor chips are connected electrically with the protruding electrodes on the both faces of the electrical insulating encapsulation resin molded member. With this configuration, the circuit boards can be connected with efficiency by using the protruding electrodes on the upper and the lower faces, and at the same time more functions can be realized because the two semiconductors are embedded therein.

Still another semiconductor package of the present invention includes an electronic component package circuit board, two semiconductor chips mounted on the electronic component package circuit board and embedded in the electrical insulating encapsulation resin molded member, protruding electrodes provided at arbitrary positions on a face of the electronic component package circuit board that is on a side opposite to a face bonded with the electrical insulating encapsulation resin molded member; and protruding electrodes provided at arbitrary positions of a surface of the electrical insulating encapsulation resin molded member on a side opposite to the face bonded with the electronic component package circuit board. With this configuration, a high-performance semiconductor package can be realized because the two semiconductor elements are embedded, and the circuit boards can be secured with efficiency because the protruding electrodes for the connection are provided on the upper and the lower faces. Furthermore, since this configuration is provided with the electronic component package circuit board at its lower face, the rewiring of the connection with the semiconductor can be realized, and therefore lead-out electrodes with a fine pitch can be configured.

A further semiconductor package of the present invention has a configuration including an electrical insulating encapsulation resin molded member with at least one active component and/or passive component embedded therein and a flexible board that is bent so that, in a part of the protruding electrodes on the both faces of the electrical insulating encapsulation resin molded member, upper and lower protruding electrodes are connected electrically with each other. With this configuration, a high-density and high-performance product can be obtained because a component such as a semiconductor is embedded, and since this configuration allows the direct connection between the upper and lower faces by the connection of the flexible board, the circuit boards can be directly connected electrically.

The following describes embodiments of the present invention, with reference to the drawings. The present invention is not limited to the following embodiments. Furthermore, the present invention may include the combination of the following embodiments.

As a first embodiment of a semiconductor package of the present invention, at least one semiconductor element and/or a passive element is embedded in an electrical insulating encapsulation resin molded member made of at least an inorganic filler and an organic resin, the electrical insulating encapsulation resin molded member having protruding electrodes on both surfaces. The embedded at least one active element and/or passive element is connected electrically with the protruding electrodes formed on the electrical insulating encapsulation resin molded member, and in a part of the protruding electrodes disposed on the both faces of the electrical insulating encapsulation resin molded member, upper and lower protruding electrodes are electrically connected by means of inner vias.

Herein, the active components include a semiconductor chip, for example. The passive components include chip components such as a chip resistor, a chip capacitor and a chip inductor.

Figure 4:
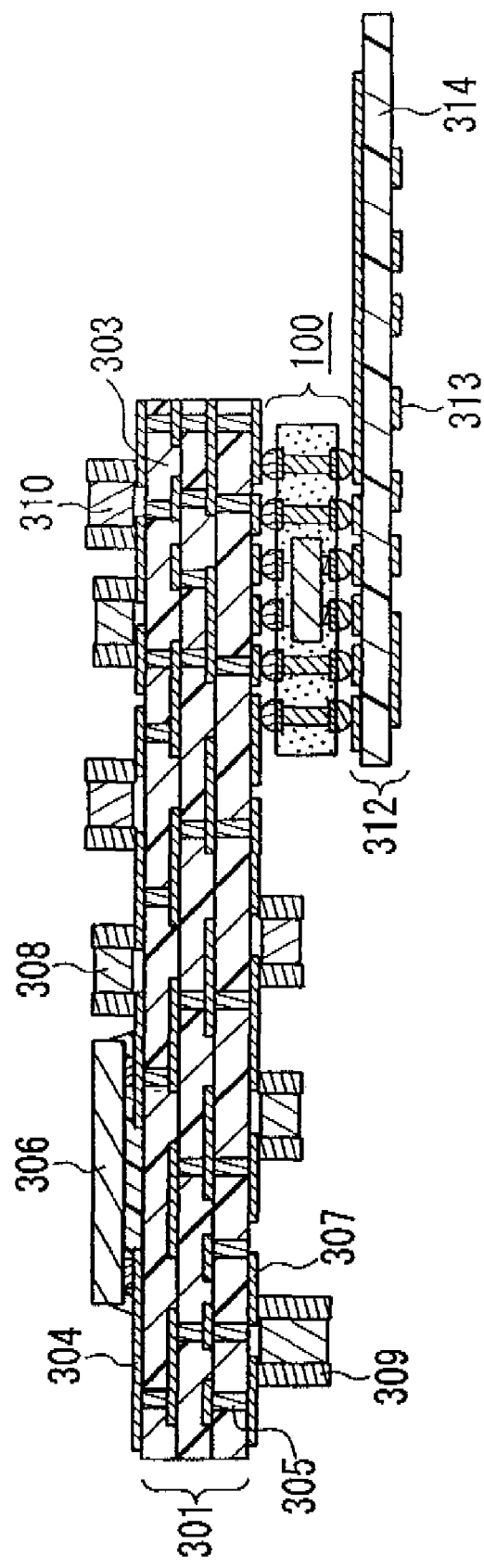
FIG. 4 is a cross-sectional view showing an electronic component packaging structure according to Embodiment 2 of the present invention.

As a result, the semiconductor package having protruding electrodes on both surfaces can be realized as shown in FIG. 1. When the semiconductor chip is packaged, chip components also may be packaged as shown in FIG. 4, which leads to an especially good effect of realizing a semiconductor package with more functions. Furthermore, the use of the mixture containing at least the inorganic filler and a thermosetting composition as the electrical insulating encapsulation resin molded member can achieve an especially good effect of allowing a thermal expansion coefficient, a thermal conductivity, and a dielectric constant to be controlled freely by selecting the inorganic filler, as compared with the conventional package.

Figure 5:
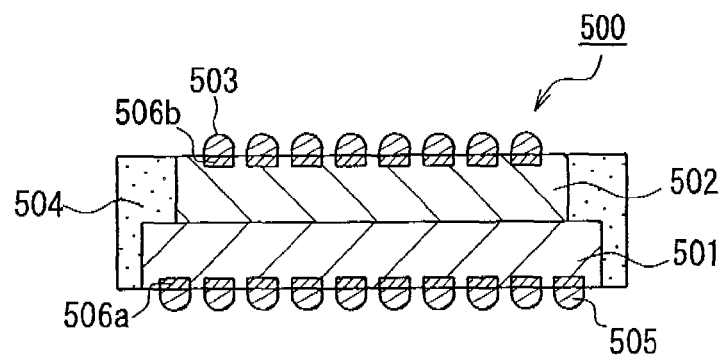
FIG. 5 is a cross-sectional view showing a configuration of an electronic component package used for an electronic component packaging structure according to Embodiment 3 of the present invention.

Furthermore, as shown in FIG. 5, the configuration in which the rear faces of semiconductor chips are bonded to each other enables a semiconductor package with a still higher density and higher performance.

Embodiment 1

FIG. 1 is a cross-sectional view showing a configuration of a semiconductor package according to this embodiment. In FIG. 1, reference numeral 101 denotes an electrical insulating encapsulation resin made of a mixture in which an inorganic filler and an organic resin are combined. Reference numeral 102 denotes a semiconductor chip that is embedded in the electrical insulating encapsulation resin 101 and is integrated therewith. Reference numeral 103 denotes an inner via that is formed in a thickness direction of the electrical insulating encapsulation resin 101, which establishes electric connection between protruding electrodes 105 and 106 that are formed on both surfaces of the electrical insulating encapsulation resin 101. In this example, the protruding electrodes 105 and 106 are formed with solder so that the protrusions are 100 μm in length and have a hemispherical shape with a diameter of 200 μm. Reference numerals 107a and 107b denote electrodes formed at the both surfaces of the electrical insulating encapsulation resin, which are base electrodes for the protruding electrodes 105 and 106. The base electrodes 107a and 107b can be formed concurrently when the semiconductor chip 102 is embedded in the electrical insulating encapsulation resin. The base electrodes can be formed as follows: a semiconductor chip 102 is mounted on a metal substrate, and an electrical insulating encapsulation resin that has been processed into a sheet form is laminated thereon. Then, heat and pressure are applied thereto so that the semiconductor chip 102 is embedded, and thereafter the metal substrate is processed so as to form the base electrodes. A lead frame with a pattern formed therein may be integrated with the electrical insulating encapsulation resin as the base electrodes.

As for the inner via 103, a method for applying copper plating or a conductive paste to a hole processed with a drill or a laser so as to establish electric connection is available. A bump 104 that is an electrode of the semiconductor chip 102 is connected electrically with the protrude electrode 106, so that input/output of electrical signals with respect to the semiconductor chip 102 can be performed via the protrusion electrode 106.

As shown in FIG. 1, since the semiconductor package includes the semiconductor chip 102 embedded therein, and allows the inner via connection between the both surfaces, this configuration can be used as a connecting member provided with a property of a semiconductor for the connection between circuit boards. As the above-stated organic resin, a thermosetting resin and a thermoplastic resin can be used. As the thermosetting resin, for example, epoxy resin, polyimide resin, polyphenylene ether resin, phenol resin, fluorine resin and isocyanate resin are available. As the thermoplastic resin, an organic film base material is available, which may be made of wholly aromatic polyester, fluorine resin, polyphenylene oxide resin, syndiotactic polystyrene resin, polyimide resin, polyamide resin, aramid resin and polyphenylene sulphide resin.

As the inorganic filler, $Al_2O_3$, MgO, BN, AlN and $SiO_2$ are available. In addition, if required, a coupling agent, a dispersing agent, a coloring agent and a release agent further may be added to the mixture of the inorganic filler and the thermosetting resin. The semiconductor chip is not limited to a silicon semiconductor, but a bipolar element, a metal oxide semiconductor (MOS) element, a silicon-germanium semiconductor with an insufficient mechanical strength, a gallium arsenide semiconductor and the like also are available.

Furthermore, a method for packaging the semiconductor chip 102 is not limited to a flip-chip packaging method as shown in FIG. 1, and a wire bonding method and the like are available. For the bump 104 that is electrically connected with the protruding electrode 106, not only solder but also a gold bump is available, and a two-stage protruding bump manufactured by wiring bonding or a bump by gold plating is available. In addition, a conductive adhesive may be used for the electric connection between the bump 104 and the protruding electrode 106.

Furthermore, as for the protruding electrodes 105 and 106, not only solder but also copper foil is available. By further applying nickel or gold plating on a surface thereof, stable electric connection with the metal bump 104 on the semiconductor chip 102 can be attained. For the inner via 103 connecting the both surfaces, not only metal plating but also a conductive paste can be used. Available as the conductive paste is a thermosetting resin such as epoxy resin kneaded with gold, silver or copper powder as a conductive material. Among them, copper is effective, because it has a good conductivity and causes minimum migration. As for the thermosetting resin, a liquid-form epoxy resin is stable in terms of the heat resistance.

The electrical insulating encapsulation resin can be molded by processing the mixture of the inorganic filler and the thermosetting resin in a sheet form and embedding the semiconductor chip 102 therein.

When manufacturing this, a method disclosed in U.S. Pat. No. 6,038,133 can be used, for example. Alternatively, this can be manufactured by transfer-molding of the mixture of the inorganic filler and the thermoplastic resin.

According to the former method, the mixture of an inorganic filler and a thermosetting resin that has been processed into a sheet form is aligned and laminated on a semiconductor chip. The processing into the sheet form is as follows: a paste-form kneaded material is prepared by mixing the inorganic filler and the liquid-form thermosetting resin or by mixing a thermosetting resin whose viscosity is reduced using a solvent with the inorganic filler, and thereafter the paste-form kneaded material is shaped so as to have a uniform thickness and a heat treatment is applied thereto so as to obtain the sheet-form member. In the case where the kneaded material is prepared using a liquid-form resin, the result has adhesion properties, Therefore, the heat treatment is performed so that such adhesion properties are eliminated by slightly curing the kneaded material while maintaining flexibility of the kneaded material in an uncured state. Further, in the case where the kneaded material is prepared by allowing a resin to be dissolved using a solvent, the heat treatment is performed so that the solvent is removed, and similarly, adhesion properties are eliminated while maintaining the flexibility of the kneaded material in an uncured state. By exploiting a reduced viscosity of the thermosetting resin in an uncured state, the semiconductor chip is embedded therein, followed by curing, whereby a package 100 with a semiconductor chip embedded therein can be obtained as shown in FIG. 1.

According to the latter transfer molding method, a semiconductor chip and inner vias which have been formed at predetermined positions are inserted into a metal mold, and then the heated and pressurized mixture of the resin is introduced into the metal mold, whereby the semiconductor package as in FIG. 1 can be manufactured.

Figure 2:
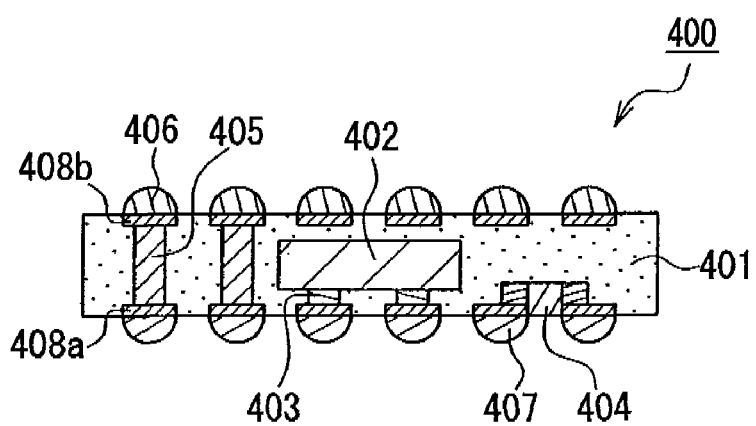
FIG. 2 is a cross-sectional view showing a configuration of another electronic component package used for the electronic component packaging structure according to Embodiment 1 of the present invention.

Additionally, as shown in FIG. 2, a chip component 404 including passive components such as a chip resistor, a chip capacitor and a chip inductor is packaged as well as a semiconductor chip 402, thereby obtaining a semiconductor package with still higher density and more functions. Reference numerals 408a and 408b denote base electrodes. Instead of the semiconductor chip, the chip component only may be packaged therein. When both of the semiconductor chip and the chip component are packaged therein, the semiconductor chip and the chip component may be electrically connected with each other. With this configuration, a module can be constituted with one semiconductor package 400.

Figure 3:
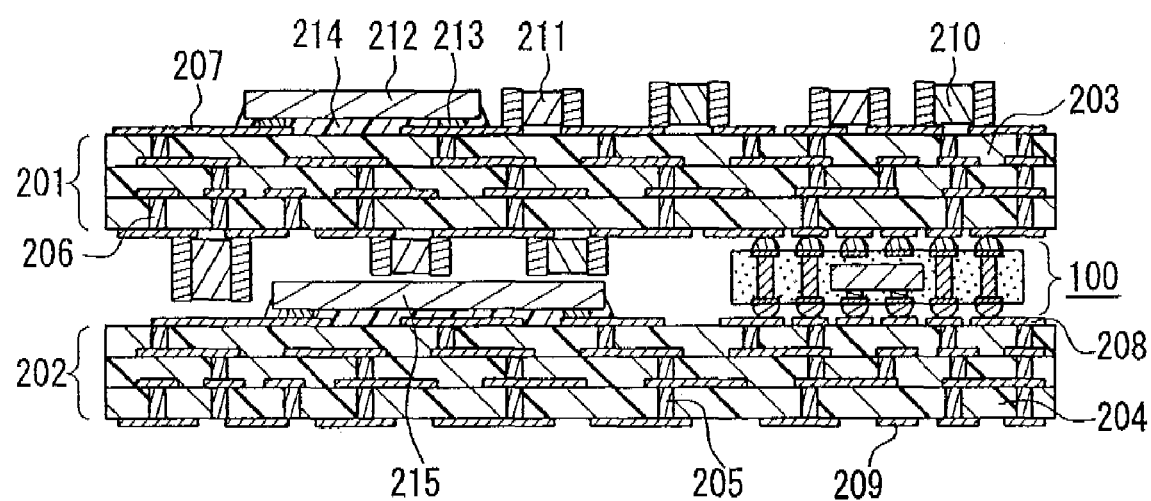
FIG. 3 is a cross-sectional view showing a configuration the electronic component packaging structure according to Embodiment 1 of the present invention.

FIG. 3 is a cross-sectional view of an electronic component packaging structure in which circuit boards are connected electrically with each other using the above-stated semiconductor package 100. Reference numerals 201 and 202 denote circuit boards that are electrically connected, and 203 and 204 denote insulation materials of the circuit boards 201 and 202. Available insulation materials of the circuit boards include a reinforcing member made of paper, glass woven fabric, glass non-woven fabric, aramid non-woven fabric or the like that is impregnated with an organic resin made of epoxy resin, cyanate resin, phenol resin or the like. Reference numerals 207, 208 and 209 denote wiring patterns, and 206 and 205 denote inner vias that connect layers. As the wiring patterns, copper foil can be used, for example, to which chemical etching can be applied so as to form a desired wiring pattern. As for the inner vias 205 and 206, copper plating or a conductive paste is applied to holes processed with a drill or a laser, so as to establish electric connection.

On the circuit boards 201 and 202, semiconductor chips 215 and 212 and chip components 211 and 210 are mounted. A method for the mounting is not limited to a mounting method using solder, but a conductive adhesive can be used. As for the semiconductor chips, wire bonding, flip-chip bonding and the like are available, and the semiconductor chips 215 and 212 may be flip-chip mounted via bumps 213 and may be encapsulated with an encapsulation resin 214. Reference numeral 100 denotes the semiconductor package shown in FIG. 1, which connects electrically the circuit board 201 and the circuit board 202 via the protruding electrodes 105 and 106, and at the same time allows the circuit boards 201 and 202 to be bonded and secured firmly with each other using solder. At this time, by binding the semiconductor package 100 and the wiring patterns 208 of the circuit boards 201 and 202 with an encapsulation resin, still firmer bonding can be carried out. Thereby, the semiconductor package 100 is not used just as an electrical connector between the circuit board 201 and the circuit board 202, but various functions possessed by the semiconductor package 100, such as a processing function, a switching function and a memory holding function, also can be utilized. As a result, a high-performance, precision and compact package can be realized.

Embodiment 2

FIG. 4 is a cross-sectional view of an electronic component packaging structure that electrically connects circuit boards with the same semiconductor package 100 as in Embodiment 1. Reference numeral 301 denotes a circuit board, which includes an insulation material 303, a wiring pattern 304 and an inner via 305. On the circuit board 301, a semiconductor chip 306 and chip components 308, 309 and 310 are mounted. The semiconductor package 100 has the same configuration as shown in FIG. 1, and has protruding electrodes 105 and 106. The semiconductor package 100 connects electrically and mechanically with another circuit board 312 by means of firm securing using solder. This circuit board 312 is not limited to the conventional circuit board as described in Embodiment 1, and a flexible board (FPC) having a wiring pattern 313 and being made of an organic film 314 can be used. As the material of the FPC, wholly aromatic polyester, fluorine resin, polyphenylene oxide resin, syndiotactic polystyrene resin, polyimide resin, polyamide resin, aramid resin and polyphenylene sulphide resin are available. These materials abound in heat resistance properties and have flexibility, so that they can be bent for use.

In this way, in addition to the capability of effectively connecting the circuit board 301 and the FPC 312 electrically and mechanically, the semiconductor package of the present invention further allows a component such as a semiconductor to be mounted, thereby enabling high-functionality and compact connection.

Embodiment 3

FIG. 5 is a cross-sectional view showing a configuration of a semiconductor package 500 according to this embodiment. In FIG. 5, reference numeral 501 denotes a semiconductor chip and 502 denotes another semiconductor chip. The semiconductor chips 501 and 502 face each other with rear faces opposite to their circuit-face side. The respective circuit faces are connected electrically with protruding electrodes 503 and 505. Reference numerals 506a and 506b are base electrodes that are formed at surfaces of the semiconductor chips 501 and 502, respectively.

Reference numeral 504 denotes an electrical insulating encapsulation resin molded member, which protects the semiconductor chips 501 and 502. The semiconductor chips 501 and 502 are secured with each other at their rear faces via an adhesive, encapsulation is conducted up to the same height as each of the surfaces of the circuit-faces using a transfer molding device, and thereafter the protruding electrodes 503 and 505 are mounted on electrodes on the circuit-faces of the respective semiconductor chips 501 and 502 using a solder ball and the like.

By conducting the transfer molding with an attached film for protecting a surface of the semiconductor chip circuit, contamination of the circuit-face side can be prevented. Furthermore, when the protruding electrodes 503 and 505 are formed on the circuit-faces using solder, an aluminum layer and further a gold plating layer can be formed as a barrier layer on the electrodes on the circuit-faces. Furthermore, as for the solder, a ball may be directly mounted thereon, followed by melting by heating, or a creamlike solder paste may be applied, followed by melting by heating.

Figure 6:
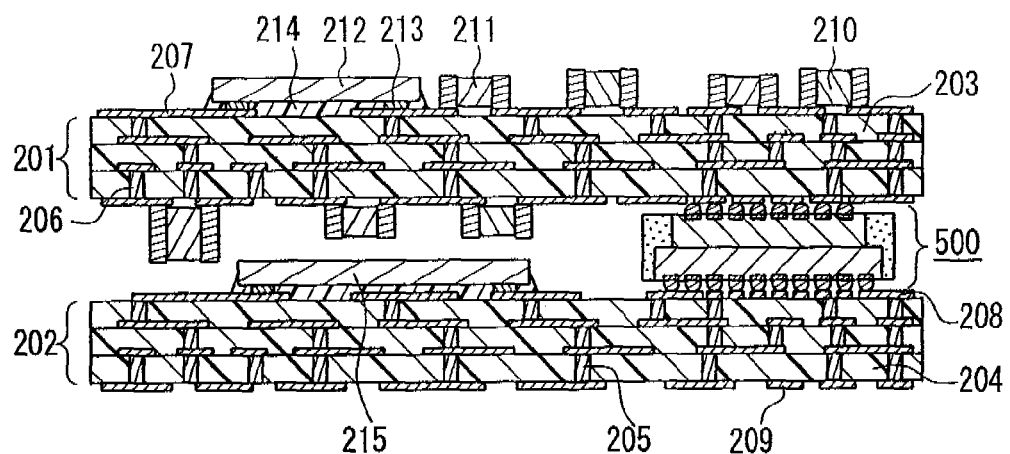
FIG. 6 is a cross-sectional view showing a configuration of the electronic component packaging structure according to Embodiment 3 of the present invention.

FIG. 6 is a cross-sectional view showing an electronic component packaging structure that electrically connects circuit boards by using the above-described semiconductor package 500. The remaining components and configurations are the same as in those of FIG. 2, and therefore the same reference numerals are used and their explanations are omitted. Only essential points are described below. The semiconductor package 500 electrically connects the circuit board 201 and the circuit board 202 via protruding electrodes, and at the same time bonds the circuit board 201 and the circuit board 202 firmly using solder. At this time, by binding the semiconductor package 500 and the wiring patterns 208 of the circuit boards 201 and 202 with an encapsulation resin, still firmer bonding can be carried out. Thereby, the semiconductor package 500 is not used just as an electrical connector between the circuit board 201 and the circuit board 202, and various functions possessed by the semiconductor package 500 also can be utilized. As a result, a high-functionality, precision and compact package can be realized.

Embodiment 4

Figure 7:
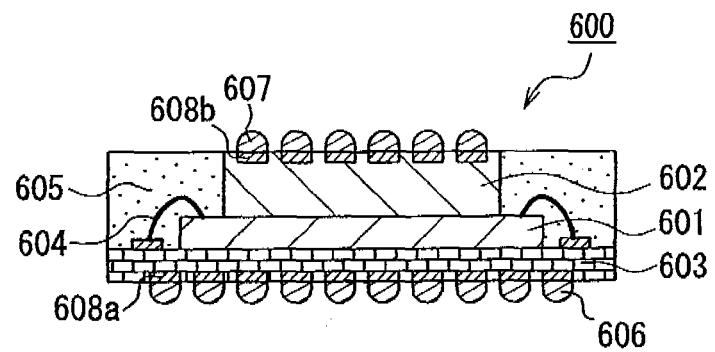
FIG. 7 is a cross-sectional view showing a configuration of an electronic component package used for an electronic component packaging structure according to Embodiment 4 of the present invention.

FIG. 7 is a cross-sectional view showing a configuration of a semiconductor package 600 according to this embodiment of the present invention. Reference numeral 601 denotes a semiconductor chip and 602 denotes another semiconductor chip. The semiconductor chip 601 and the semiconductor chip 602 are die-bonded on a circuit board 603 in a face-up manner so that their circuit faces are directed upwardly. The semiconductor chip 601 mounted directly on the circuit board 603 is electrically connected with a wiring pattern on the circuit board 603 by a wire bonding method. The semiconductor chip 602 is die-bonded on the semiconductor chip 601 in a face-up manner, and a protruding electrode 607 is formed on the semiconductor chip 602 via an electrode 608b formed therein. Reference numeral 605 denotes an electrical insulating encapsulation resin molded member, which protects the semiconductor chips 601 and 602. The semiconductor chips 601 and 602 are secured with an adhesive and the like, and encapsulation is conducted so as to be coplanar with the surface of the circuit-face using a transfer molding device. Then, a protruding electrode 606 is mounted on a wiring pattern 608a formed on the circuit board 603 using a solder ball and the like. By conducting the transfer molding in a state where a film for protecting a surface of the semiconductor chip circuit is attached, contamination of the circuit-face side can be prevented. Furthermore, when the protruding electrodes 607 are formed on the circuit-faces using solder, an aluminum layer and further a gold plating layer can be formed as a barrier layer on the electrodes 608b on the circuit-faces. Furthermore, as for the solder, a ball may be directly mounted thereon, followed by melting by heating, or a creamlike solder paste may be applied, followed by melting by heating. Furthermore, on the semiconductor chip, a protective film (not illustrated) made of silicon nitride, polyimide may be formed so as to protect the portions other than the electrodes on the circuit-faces. Furthermore, the circuit board may be a printed circuit board such as a ceramic board and a glass epoxy board.

Figure 8:
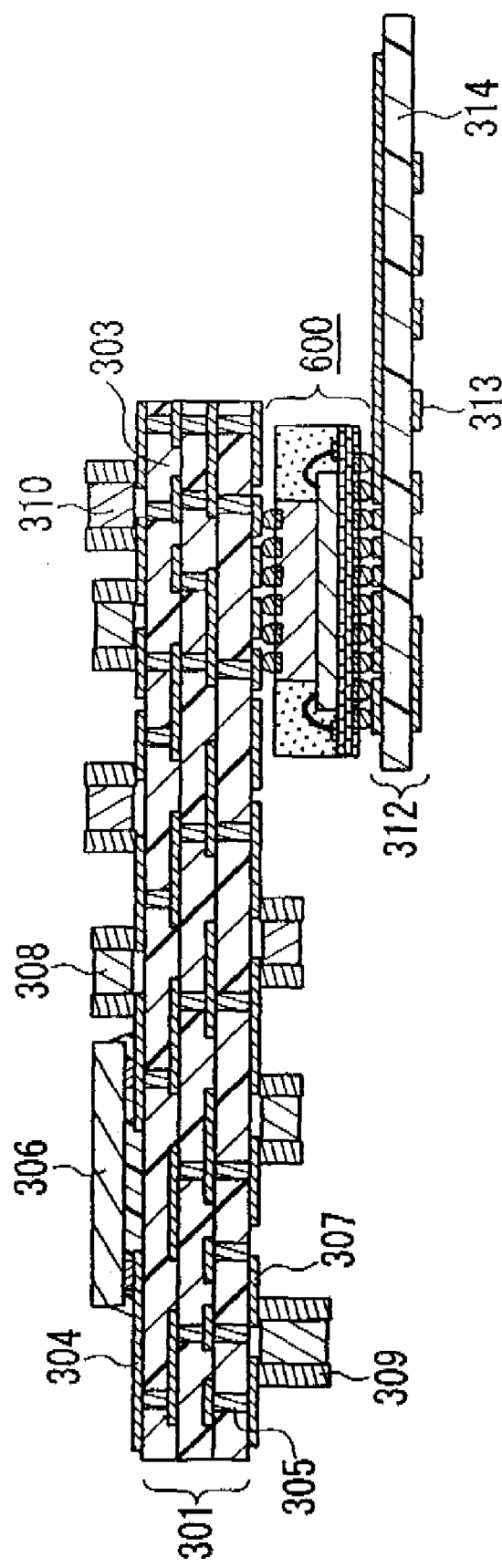
FIG. 8 is a cross-sectional view showing a configuration of the electronic component packaging structure according to Embodiment 4 of the present invention.

FIG. 8 is a cross-sectional view of an electronic component packaging structure that electrically connects circuit boards using the above-stated semiconductor package 600. The remaining components and configurations are the same as in those of FIG. 3, and therefore the same reference numerals are used and their explanations are omitted. Only essential points are described below. The semiconductor package 600 electrically connects a circuit board 301 and a circuit board 312 via protruding electrodes, and at the same time bonds the circuit board 301 and the circuit board 312 firmly using solder. At this time, by binding the semiconductor package 600 and the wiring patterns of the circuit boards 301 and 312 with an encapsulation resin, still firmer bonding can be carried out. Thereby, the semiconductor package 600 is not used just as an electrical connector between the circuit board 301 and the circuit board 312, and various functions possessed by the semiconductor package 600 also can be utilized. As a result, a high-functionality, precision and compact package can be realized.

Embodiment 5

Figure 9:
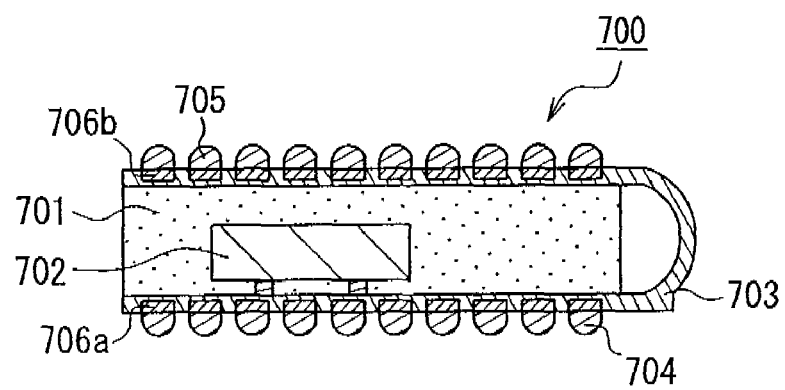
FIG. 9 is a cross-sectional view showing a configuration of an electronic component package used for an electronic component packaging structure according to Embodiment 5 of the present invention.

FIG. 9 is a cross-sectional view showing a configuration of a semiconductor package according to this embodiment. In FIG. 9, reference numeral 701 denotes an electrical insulating encapsulation resin molded member with a semiconductor chip 702 embedded therein, and 703 denotes a flexible board (FPC) 703 having wirings patterns 706a and 706b. The FPC 703 is bent as shown in FIG. 9, and protruding electrodes 704 and 705 are formed on surfaces of the wirings patterns 706a and 706b at the both surfaces, respectively. The semiconductor chip 702 is mounted in the FPC 703, and is embedded with an electrical insulating encapsulation resin, and thereafter the FPC is bent so as to be bonded with the electrical insulating encapsulation resin molded member, and the protruding electrodes 704 and 705 are formed as stated above. The wiring patterns are formed in the FPC 703, and therefore electric connection can be established via the protruding electrodes 704 and 705 with the FPC 703. With this configuration, there is no need to form an inner via in the electrical insulating encapsulation resin molded member, and therefore this configuration is advantageous in terms of the mass productivity and a cost. The thus obtained semiconductor package 700 may be used in the same manner as in the semiconductor package 100 of FIG. 3 or FIG. 4, the semiconductor package 500 in FIG. 6 and the semiconductor package 600 in FIG. 8.

Embodiment 6

Figure 10:
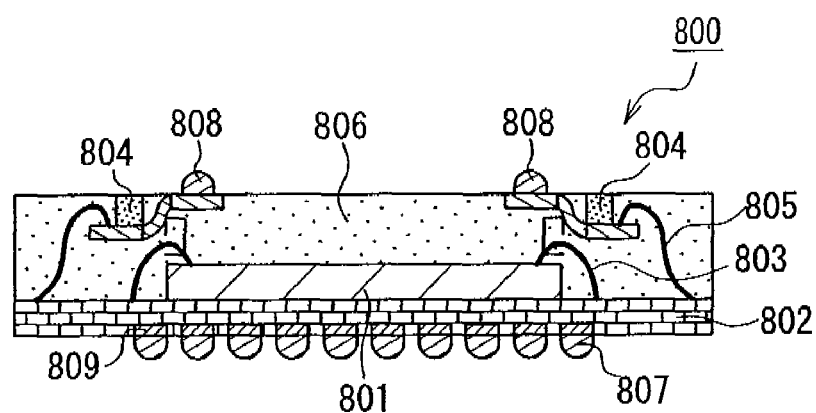
FIG. 10 is a cross-sectional view showing a configuration of an electronic component package used for an electronic component packaging structure according to Embodiment 6 of the present invention.

FIG. 10 is a cross-sectional view showing a configuration of a semiconductor package according to this embodiment. In FIG. 10, reference numeral 802 denotes a circuit board in which insulation layers and wiring patterns are formed in an arbitrary laminated manner, and these layers are connected with an inner via. On the circuit board 802, a semiconductor chip 801 is mounted, and the semiconductor chip 801 is connected with a wiring pattern on the circuit 802 via a wire 803. Another wiring pattern on the circuit board 802 is connected with a lead frame 804 via a wire 805. The lead frame 804 is bent as shown in FIG. 10 so as to prevent the wire 805 connected therewith by the wire bonding from being exposed to the surface of the semiconductor package. Reference numeral 809 denotes a wiring pattern formed at a surface of the circuit board 802, and a protruding electrode 807 is formed on a surface of this wiring pattern 809 An electrical insulating encapsulation resin molded member 806 encapsulates these circuit board 802, semiconductor chip 801, wires 803 and 805 and lead frame 804 so as to protect and secure the same, and on the surfaces of the circuit board and the electrical insulating encapsulation resin molded member, protruding electrode 807 and 808 are formed, respectively. Available materials of the circuit board 802 are a reinforcing member made of paper, glass woven fabric, glass non-woven fabric, aramid non-woven fabric and the like that are impregnated with an organic resin made of epoxy resin, cyanate resin, phenol resin and the like, in which layers are inner-via connected using a conductive paste. For the semiconductor chip 801, not only a flip-chip method but also a wire bonding method is available.

The thus obtained semiconductor package 800 may be used in the same manner as in the semiconductor package 100 of FIG. 3 or FIG. 4, the semiconductor package 500 in FIG. 6 and the semiconductor package 600 in FIG. 8.

Embodiment 7

Figure 11:
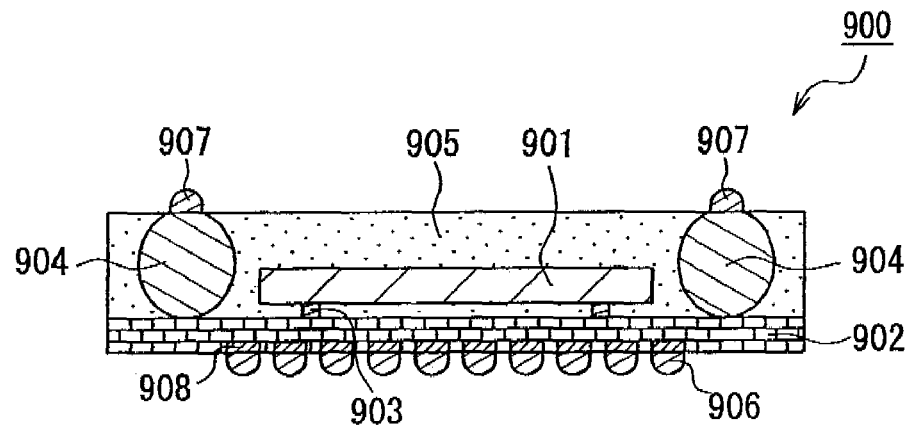
FIG. 11 is a cross-sectional view showing a configuration of an electronic component package used for an electronic component packaging structure according to Embodiment 7 of the present invention.

FIG. 11 is a cross-sectional view showing a configuration of a semiconductor package according to this embodiment. In FIG. 11, reference numeral 902 denotes a circuit board in which insulation layers and wiring patterns are formed in an arbitrary laminated manner, and these layers are connected with an inner via, as in the case of the previous embodiment. On the circuit board 902, a semiconductor chip 901 is mounted by a flip-chip packaging method, and the semiconductor chip 901 is connected with a wiring pattern on the circuit board 902 via a bump 903. Another wiring pattern on the circuit board 902 is connected with a protruding electrode 907 via a metal ball 904. Reference numeral 908 denotes a wiring pattern formed at a surface of the circuit board 902, and a protruding electrode 906 is formed on this wiring pattern 908.

An electrical insulating encapsulation resin molded member 905 encapsulates these circuit board 902, semiconductor chip 901 and metal ball 904 so as to protect and secure the same, and further the protruding electrodes 906 and 907 are formed on a surface of the circuit board and the electrical insulating encapsulation resin molded member, respectively. The metal ball 904 is mounted on the circuit board 902 on which the semiconductor chip 901 has been mounted, encapsulation is conducted with the electrical insulating encapsulation resin so as to cover the metal ball, followed by grinding so that a very small part of the surface of the metal ball 904 is exposed, and the protruding electrode is formed on the exposed metal ball. A material of the metal ball 904 is not limited to copper, solder and the like, and a resin ball whose surface is plated with metal also is available. The connection between the circuit board 902 and the metal ball 904 is not limited to solder, and the packaging with a conductive adhesive also is available.

Furthermore, a plurality of semiconductors may be mounted on the circuit board, metal balls may be mounted on the periphery of the respective semiconductor chips, followed by encapsulation and the formation of protruding electrodes, which may be subsequently cut into the individual pieces with a laser or by dicing so as to obtain the semiconductor package.

Figure 12A:
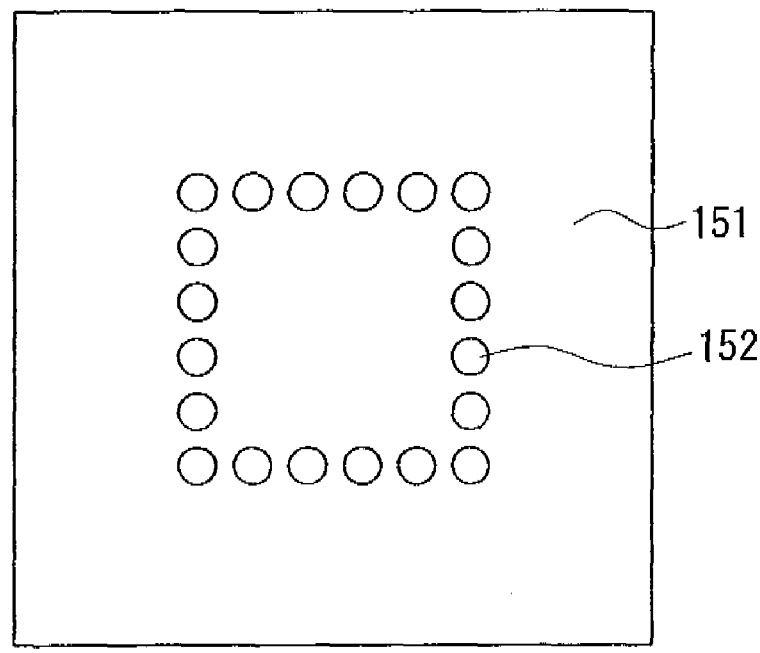
FIG. 12A is a schematic top plan view of the electronic component package according to Embodiment 7 of the present invention.
Figure 12B:
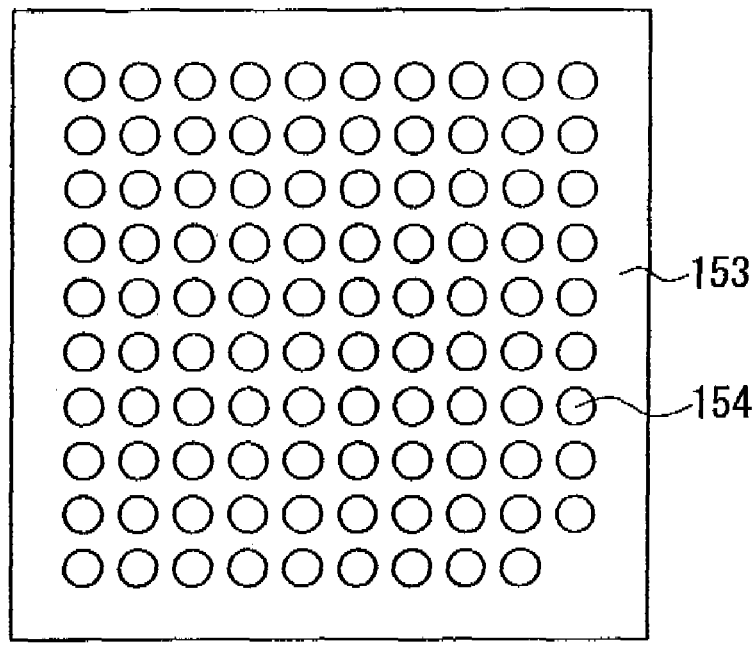
FIG. 12B is a rear plan view of the same.

FIGS. 12A and 12B are schematic views of the semiconductor package having the above-stated configuration, which is viewed from its upper and lower faces. FIG. 12A is a plan view when viewing from the above, where reference numeral 151 denotes the electrical insulating encapsulation resin molded member, and 152 denotes the upper protruding electrodes. FIG. 12B is a rear plan view of the same when viewing from a side of the circuit board, where reference numeral 153 denotes a circuit board and 154 denotes protruding electrodes that are arranged in a grid form on the circuit board 153. Although the protruding electrodes are arranged only at a limited part in FIG. 12A, they may be arranged in a grid form as in FIG. 12B. By arranging the protruding electrodes in a grid form at both of the upper and lower faces, high density connection can be established.

Figure 13:
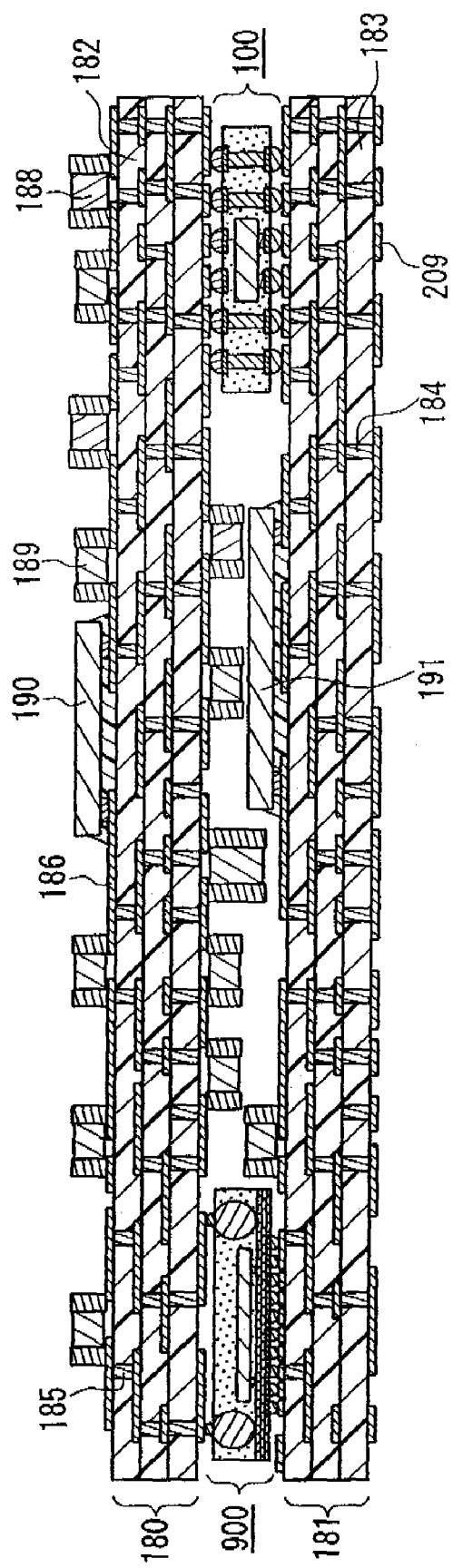
FIG. 13 is a cross-sectional view showing a configuration of the electronic component packaging structure according to Embodiment 7 of the present invention.

FIG. 13 is a cross-sectional view showing a configuration in which circuit boards are connected electrically by using the semiconductor package 900 of this embodiment and the semiconductor package 100 of FIG. 1. Reference numerals 180 and 181 denote circuit boards to be electrically-connected, and 182 and 183 denote insulation materials of the circuit boards 180 and 181, respectively. Available insulation materials of the circuit boards, as in the case of Embodiment 1, are a reinforcing member made of paper, glass woven fabric, glass non-woven fabric, aramid non-woven fabric and the like that are impregnated with an organic resin made of epoxy resin, cyanate resin, phenol resin and the like, Reference numerals 186 and 209 denote wiring patterns of the circuit boards 180 and 181, and 185 and 184 denote inner vias that connect layers.

On the circuit boards 180 and 181, semiconductor chips 190 and 191 and chip components 188 and 189 are mounted. As for the semiconductor chips, a flip-chip packaging method is available, and the semiconductor chips 190 and 191 are connected with wiring patterns on the circuit boards via bumps.

In order to electrically connect the circuit boards 180 and 181 with a narrow pitch, this embodiment shows an example where two semiconductor packages are used. By using the two semiconductor packages 100 and 900 for connecting circuit boards 180 and 181 in the vicinity of both end portions of the circuit boards as in FIG. 13, a package that not only allows the electrical connection with a narrow pitch but also provides an excellent mechanical strength can be obtained.

Embodiment 8

Figure 14A:
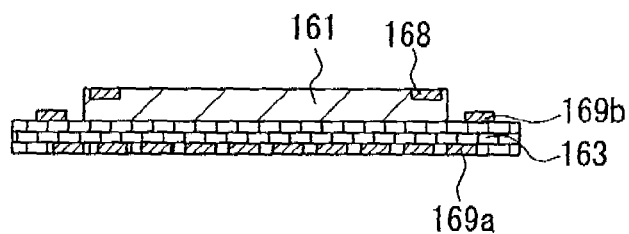
FIGS. 14A to 14E are cross-sectional views showing the steps of a manufacturing process of the electronic component package according to Embodiment 8 of the present invention.

FIGS. 14A to E are cross-sectional views showing the respective steps of one example of a manufacturing process of the semiconductor package shown in FIG. 7. In FIG. 14A, reference numeral 163 denotes a circuit board, 161 denotes a semiconductor chip, 168 denotes an electrode formed on the semiconductor chip 161 and 169a and 169b denote wiring patterns formed on both surfaces of the circuit board 163. A die-bond paste is applied on the circuit board 163, and the semiconductor chip 161 is mounted thereon, followed by heating so as to cure the die-bond paste. As for the die-bond paste, a mixture of silver powder as a conductive filler with a thermosetting resin is available. The paste may be applied by printing or may be applied by a dispenser.

Figure 14B:
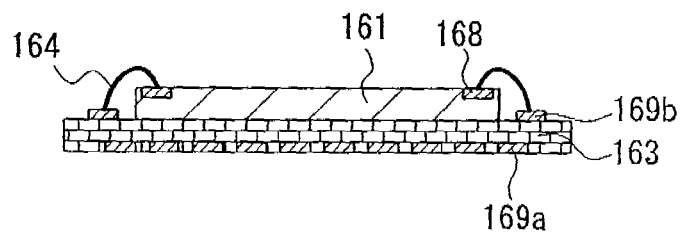

Next, as shown in FIG. 14B, wire bonding is performed between an electrode pattern of the semiconductor chip 161 and the wiring pattern of the circuit board using a gold wire. It is preferable to provide an aluminum electrode to the electrode of the semiconductor chip 161 so as to facilitate the attachment of the gold wire. The wiring pattern of the circuit board is formed from copper foil by a chemical etching method, and about 5 μm-thick nickel plating and 0.05 μm or more thick gold plating preferably are applied to the copper foil in order to avoid a deterioration of adhesion with the wire, which results from oxidization of the copper electrode. The wiring bonding preferably is conducted by firstly melting by heating of a ball that is formed on the electrode of the semiconductor chip 161 side, and by bonding it on the wiring pattern side.

Figure 14C:
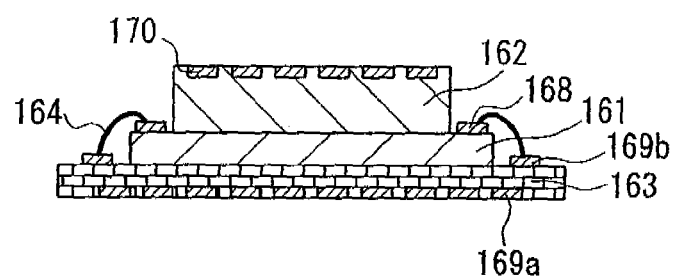

Next, as shown in FIG. 14C, the other semiconductor chip 162 is die-bonded in the same manner as stated above. At this time, the semiconductor chip 162 is mounted on a circuit-face of the semiconductor chip 161, and therefore the circuit-face of the semiconductor chip 161 is preferably protected with an insulation film made of polyimide and the like. Reference numeral 170 denotes an electrode formed at a surface of the semiconductor chip 162.

Figure 14D:
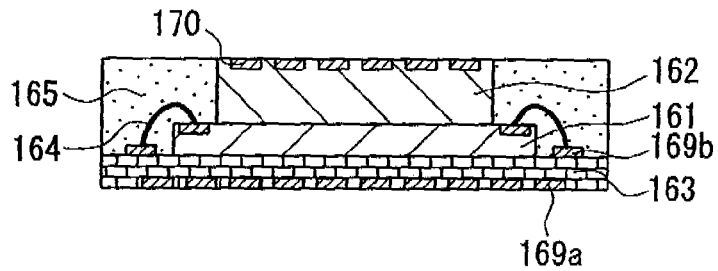

Next, as shown in FIG. 14D, encapsulation is conducted with an encapsulation resin 165 up to the circuit face of the semiconductor chip 162. As for the encapsulation resin, the materials shown in Embodiment 1 may be used. Alternatively, the encapsulation may be conducted so as to cover the entire semiconductor chip 162, and thereafter grinding may be conducted so as to reach the electrode at the surface of the semiconductor chip 162.

Figure 14E:
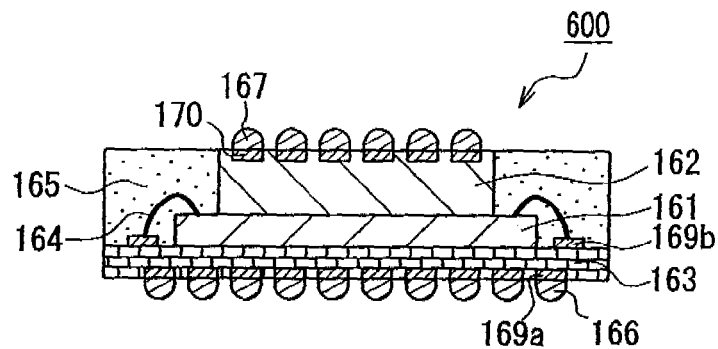

Finally, as shown in FIG. 14E, protruding electrodes 166 and 167 are formed on the wiring pattern 169a at the surface of the circuit board 163 and on the electrode 170 at the surface of the semiconductor chip 162, so that the semiconductor package can be manufactured. The protruding electrodes 166 and 167 are not limited to a metal ball such as solder, and they may be formed by printing a solder paste on the electrodes and by melting the solder.

As stated above, the two semiconductor chips are mounted on the circuit board, whereby a high-performance and high-density semiconductor package 600 can be obtained. Moreover, the use of the circuit board allows the wirings that are connected with the semiconductor chips with a narrow pitch to be connected again, so as to allow the formation of lead-out electrodes that are protruding electrodes in a grid form.

In the above embodiment, preferably a plurality of semiconductor chips are mounted on a circuit board in a large sheet form, encapsulation is conducted with the entire sheet with an electrical insulating encapsulation resin, and finally it is divided into a desired shape. This allows the packaging and the encapsulation to be conducted collectively, thus enabling mass production and a reduction in cost.

In the above embodiment, during the encapsulation with the electrical insulating encapsulation resin, preferably, a mixture of a thermosetting resin in an uncured state and an inorganic filler may be processed into a sheet form, and a semiconductor chip is embedded in this sheet-form member. This allows the semiconductor chip to be embedded therein without a damage, and can reduce an internal stress.

The following describes specific examples of the present invention in detail.

EXAMPLE 1

When manufacturing a semiconductor package of the present invention, a circuit board used was an aramid epoxy multilayered board in which aramid non-woven fabric was impregnated with an epoxy resin. As for the aramid epoxy multilayered board, 18 μm thick copper foil was used, and this was the multilayered board having an inner via structure using a conductive paste. The size of the board was 120 mm×120 mm and 0.4 mm in thickness, and was a four-layered wiring board. As for a surface wiring layer, one obtained by applying 5 μm thick nickel plating and further 0.05 μm thick gold plating was used.

Next, a conductive paste was applied at portions where semiconductor chips are to be mounted on a surface of the aramid epoxy multilayered board, and subsequently thirty-six semiconductor chips in total (10 mm×10 mm, thickness 0.2 mmt) were mounted in a matrix form of 6×6. A heat treatment was conducted to the multilayered board on which the semiconductor chips had been mounted at 150° C. for 30 minutes, so as to cure the conductive adhesive. The semiconductor chips used were formed as not a real circuit but just an aluminum wiring for performing a connection reliability test, and portions other than connection portions on the surface thereof were coated with a polyimide resin insulation layer. The wiring pattern portions of the multilayered board and the electrodes of the thus manufactured semiconductor chips were connected by wire bonding using a gold wire of 25 μm in diameter. Furthermore, another semiconductor chip was mounted on each of the semiconductor chips using a conductive adhesive in a similar manner as stated above.

The thus manufactured multilayered board on which two semiconductor chips had been mounted and a sheet-form member made of an electrical insulating encapsulation resin containing an inorganic filler and a thermosetting resin were laminated, and heat and pressure were applied thereto so as to embed the semiconductor chips in the mixture layer. As the conditions for the applied heat and pressure, the multilayered board on which the semiconductor chips had been mounted was placed in a metal mold heated at 150° C., the sheet-form member further was placed, and then pressure was applied at $9.8 \times 10^2$ Pa (100 Kg/cm$^2$) using the metal mold. This was kept for 15 minutes.

The used mixture sheet was made of the following inorganic filler and thermosetting resin. The sheet-form member used in this example was manufactured by mixing the inorganic filler and the liquid-form thermosetting resin using a mixer. The mixer used receives the inorganic filler and the liquid-form thermosetting resin in a vessel with a predetermined capacity and revolves as it spins the vessel, and is capable of obtaining a sufficiently diffused state even if the mixture has a relatively high viscosity. The composition of the sheet-form member for the semiconductor built-in module in this example was as follows:
(1) inorganic filler: $Al_2O_3$ 90 wt % (produced by Showa Denko K.K., 'AS-40', spherical form 12 μm)
(2) thermosetting resin: liquid-form epoxy resin 9.5 wt % (produced by Japan REC Co., Ltd, 'EF-450')
(3) others: Carbon black 0.2 wt % (produced by Toyo Carbon)
(4) Coupling agent: 0.3 wt % (produced by AJINOMOTO CO., INC. titanate based-coupling agent '46B'):

The specific method for manufacturing the sheet-form member was as follows: a predetermined amount of a paste-form mixture that had been weighed and mixed to have the above-stated composition was dropped onto a mold-release film. A predetermined amount of the inorganic filler and the liquid-form epoxy resin were charged into the vessel, and the materials in the vessel were mixed using a kneader. The kneader let the vessel revolve while it spins the vessel, and the kneading is conducted for a short time period of about 10 minutes. For the mold-release film, a 75 μm thick polyethylene terephthalate film with a surface that has been subjected to a silicon release agent was used.

Next, a mold-release film is further stacked on the dropped mixture on the mold-release film and these are pressed to a uniform thickness by a compressing press. Thus, the above-stated mixture was shaped into a sheet-form member that was 500 μm in thickness and did not have adhesion properties. Since the above-stated thermosetting epoxy resin had a curing start temperature at 130° C., the resin was in an uncured state (B stage) under the above-stated heat treatment conditions, and therefore it could be made molten again by heating in the later steps.

The mold-release films were peeled off from the both surfaces of the thus obtained sheet-form member, and the semiconductor chips were embedded and curing was conducted according to the above-stated method. The semiconductor chips were embedded by applying heat at a temperature of 150° C. and pressure of 0.4 MPa, and this state was held for two hours so as to obtain a completely cured state.

The thus obtained multilayered board in which the semiconductor chips had been embedded was ground from the side of the semiconductor surface so as to reach surface electrode portions of the semiconductor chips (See FIG. 14D). The grinding was conducted using a normal lapping machine so that a thickness of the board became 0.8 mm.

The thus manufactured semiconductor package 600 used alumina as the inorganic filler, and therefore a 20 times or higher thermal conductivity could be obtained as compared with the conventional glass epoxy board. Similarly, when various inorganic fillers were used instead of alumina, even in the case of AlN and MgO used, a thermal conductivity larger than the conventional one could be obtained.

When amorphous SiO2 is used, a thermal expansion coefficient close to that of the silicon semiconductor can be obtained. Therefore, this configuration is a promising one for a board for flip-chip by which a semiconductor is directly mounted. Furthermore, by making use of a favorable thermal conductivity of AlN, a thermal conductivity close to that of a ceramic board can be obtained. Furthermore, when BN is added thereto, a high thermal conductivity and low thermal expansion properties can be obtained. Especially, a group using alumina enables a favorable thermal conductivity when 85 wt % or more is included, and the cost also is low, so that this is a promising one for a high thermal conductivity package. Furthermore, a group using $SiO_2$ enables a lower dielectric constant than others and a specific gravity also is small, so that this is effective for the application at high frequencies, such as mobile phones.

Finally, solder balls with a diameter of 0.4 mm were mounted on the multilayered board and the semiconductor chip electrodes using a solder ball mounter. Thus, the semiconductor package was manufactured by the above-stated method.

On the wiring pattern of the semiconductor module of the present invention, a semiconductor chip and an electronic component further can be mounted, and therefore a significantly high-density packaged semiconductor module can be obtained.

The thus manufactured semiconductor package not only allows circuit boards to be connected with each other, but also has an especially good effect of allowing a semiconductor chip and a passive component to be mounted on protruding electrodes manufactured on a side of the semiconductor chip as well, thus enabling a still higher-density package.

When embedding the mounted semiconductor chips, the pressure was applied until the resin was cured at a temperature of 150° C. However, as another effective method, pressure may be applied for two minutes at 100° C., the curing start temperature or lower of the thermosetting resin, or lower so that the semiconductor chips can be embedded using the melting viscosity of the thermosetting resin, and then the pressure may be released and heat may be applied up to 150° C. so as to cure the resin. This allows the embedding of the semiconductor to be conducted separately from the curing the thermosetting resin, and therefore the embedding that requires the application of the pressure can be conducted for a short time period and processes required for the curing can be collectively conducted as in a batch treatment, so that this process has an especially good effect of shortening the required total time.

Next, as shown in FIG. 8, the circuit board 301 and the circuit board 312 were electrically connected via the protruding electrodes using the above-stated semiconductor package 600, and at the same time the circuit boards 301 and 312 were firmly bonded and secured to each other using solder.

More specifically, as the circuit board 301 having an inner via structure across the entire layers, a four-layered wiring structured aramid epoxy resin board was used. Nickel and gold plating were applied to a wiring pattern of this aramid epoxy resin board in the same manner as above so as to facilitate soldering, and a solder paste was printed using a metal mask on the wiring pattern subjected to the gold plating. The material of the solder used was Pb free solder made of Sn—Ag—Cu. The above-stated semiconductor package 600 was aligned with the portions where the solder had been printed and was mounted thereon. Thereafter, by using a solder reflow device, soldering was conducted on the aramid epoxy resin board 301 on which the semiconductor package 600 had been mounted. The reflow was conducted under the profile of once keeping a temperature at 150° C. and then applying heat so as to reach 250° C., where the state at 250° C. was kept for about 10 seconds. As a result, protruding electrodes on the semiconductor package 600 and the wiring pattern 304 on the aramid epoxy resin board 301 were connected electrically and mechanically using the solder. Next, other protruding electrodes on the semiconductor package 600 and the wiring pattern of the FPC 312 were connected. The FPC 312 included a base film made of polyimide and wiring patterns were connected on both faces of the base film via adhesive layers. Similarly to the above, the solder paste like the above was printed on the wiring pattern 313 of the FPC 312 using a metal mask, and the FPC 312 was aligned with the protruding electrodes on a semiconductor package 600 on a different side from the above, and soldering was conducted by a reflow device while keeping their positions.

As a result, the desired wiring patterns of the aramid epoxy resin board 301 and the FPC 312 could be connected electrically and mechanically via the protruding electrodes of the semiconductor package 600.

Not only is the FPC mounted for taking input/output signals out of the high-density aramid epoxy resin board 301 with the semiconductor and the chip component mounted thereon, but also the connection with the semiconductor package 600 with two semiconductor chips embedded therein is utilized, and therefore a high-density package not only for the input/output applications but also having functions possessed by the semiconductor package 600 can be obtained.

This packaging structure is compact as compared with the conventional connector and can be ready for a narrow pitch, and also enables mechanically firm connection and is effective for the miniaturization.

In the above example, although the semiconductor chips were mounted by wire bonding, a flip-chip packaging method using a conductive paste and a solder bump, a method in which conductive fillers are dispersed into a thermosetting resin sheet and bumps are compressed so that conductivity can be exerted only at the bump portions also are available.

Note here that although the present invention shows an example of two semiconductor chips used, another configuration also is possible in which a penetrating electrode is formed with one semiconductor chip and protruding electrodes are led out from both surfaces of the semiconductor chip.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic component packaging structure, comprising:
    circuit boards each having a wiring at least on a surface thereof; and
    an electronic component package secured between the circuit boards,
    wherein the electronic component package includes at least one electronic component embedded within an electrical insulating encapsulation resin molded member made of an inorganic filler and a resin, the at least one electronic component being selected from an active component and a passive component,
    protruding electrodes are arranged on both faces of the electrical insulating encapsulation resin molded member, and the electronic component is connected electrically with at least a part of the protruding electrodes, and
    wherein the electronic component comprises at least two semiconductor elements whose faces on sides opposite to their circuit-formation faces are directly attached together, and
    a thickness of the electrical insulating encapsulation resin molded member is substantially equal to a total thickness of the two semiconductor elements.

2. The electronic component packaging structure according to claim 1, wherein the circuit boards are one in which thermosetting resin is impregnated with a reinforcing material.

3. The electronic component packaging structure according to claim 1, wherein the circuit boards are a resin film made of a thermoplastic resin.

4. The electronic component packaging structure according to claim 2, wherein the thermosetting resin is at least one selected from the group consisting of epoxy resin, polyimide resin, polyphenylene ether resin, phenol resin, fluorine resin and isocyanate resin.

5. The electronic component packaging structure according to claim 3, wherein the resin film is at least one selected from the group consisting of wholly aromatic polyester, fluorine resin, polyphenylene oxide resin, syndiotactic polystyrene resin, polyimide resin, polyamide resin, aramid resin and polyphenylene sulphide resin.

6. The electronic component packaging structure according to claim 1, wherein the resin constituting the electrical insulating encapsulation resin molded member made of the inorganic filler and the resin is a thermosetting resin.

7. The electronic component packaging structure according to claim 6, wherein the inorganic filler is at least one selected from the group consisting of $SiO2$, $Al_2O_3$, $MgO$, $TiO_2$, $BN$, $AlN$ and $Si_3N_4$.

8. The electronic component packaging structure according to claim 6, wherein the thermosetting resin is at least one selected from the group consisting of epoxy resin, polyimide resin, polyphenylene ether resin, phenol resin, fluorine resin and isocyanate resin.

9. The electronic component packaging structure according to claim 1, wherein the protruding electrodes are formed with solder.

10. The electronic component packaging structure according to claim 1, wherein the protruding electrodes are formed on electrode plates.

* * * * *